United States Patent
Lee et al.

(10) Patent No.: US 12,125,657 B2
(45) Date of Patent: Oct. 22, 2024

(54) PATTERN FUSE AND METHOD OF MANUFACTURING THE SAME

(71) Applicant: LG Energy Solution, Ltd., Seoul (KR)

(72) Inventors: Chang Bog Lee, Daejeon (KR); Sang Eun Jung, Daejeon (KR); Sung Gyu Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 0 days.

(21) Appl. No.: 18/367,824

(22) Filed: Sep. 13, 2023

(65) Prior Publication Data

US 2023/0420208 A1    Dec. 28, 2023

Related U.S. Application Data

(63) Continuation of application No. PCT/KR2022/015228, filed on Oct. 7, 2022.

(30) Foreign Application Priority Data

Oct. 28, 2021 (KR) .................. 10-2021-0145980
Nov. 3, 2021 (KR) .................. 10-2021-0149435
(Continued)

(51) Int. Cl.
*H01H 85/041* (2006.01)
*H01H 85/00* (2006.01)
(Continued)

(52) U.S. Cl.
CPC ...... *H01H 85/046* (2013.01); *H01H 85/0013* (2013.01); *H01H 85/0241* (2013.01);
(Continued)

(58) Field of Classification Search
CPC ............ H01H 85/046; H01H 85/0013; H01H 85/0241; H01H 85/20; H01H 2085/0275;
(Continued)

(56) References Cited

U.S. PATENT DOCUMENTS 5,290,835 A * 3/1994 Hatayama ............. H01L 23/145
                                                          524/109
7,094,069 B1 * 8/2006 Saydam ................. H01R 4/028
                                                          439/70
(Continued)

FOREIGN PATENT DOCUMENTS

CN        107464732 B    1/2020
JP        2006237008 A   9/2006
(Continued)

OTHER PUBLICATIONS

International Search Report for PCT/KR2022/015228 mailed Jan. 12, 2023. 4 pages.
(Continued)

*Primary Examiner* — Jacob R Crum
(74) *Attorney, Agent, or Firm* — Lerner David LLP

(57) ABSTRACT

A pattern fuse includes a lower film layer, an adhesive layer stacked on the lower film layer, a circuit pattern made of a conductive material and provided on the adhesive layer, an upper film layer stacked on the adhesive layer and the circuit pattern and a coating layer configured to cover the opening of the upper film layer, wherein the coating layer includes a flame retardant material. The upper film layer has an opening formed therein that is configured to allow a part or the entirety of the circuit pattern to be exposed therethrough. A method of manufacturing the pattern fuse is also provided.

22 Claims, 3 Drawing Sheets

(30) Foreign Application Priority Data

Nov. 3, 2021 (KR) .................. 10-2021-0150061
Sep. 30, 2022 (KR) .................. 10-2022-0125697

(51) Int. Cl.

| | |
|---|---|
| *H01H 85/02* | (2006.01) |
| *H01H 85/046* | (2006.01) |
| *H01H 85/20* | (2006.01) |
| *H01M 50/583* | (2021.01) |

(52) U.S. Cl.

CPC .......... *H01H 85/20* (2013.01); *H01M 50/583* (2021.01); *H01H 2085/0275* (2013.01); *H01H 2085/0414* (2013.01)

(58) Field of Classification Search

CPC ..... H01H 69/022; H01H 85/165–1755; H01H 2085/0412–0414; H01M 50/583; H05K 1/0293

See application file for complete search history.

(56) References Cited

U.S. PATENT DOCUMENTS

| | | | | |
|---|---|---|---|---|
| 2002/0113685 A1* | 8/2002 | Izaki | ............. | H01M 50/574 |
| | | | | 337/404 |
| 2003/0142453 A1 | 7/2003 | Parker et al. | | |
| 2004/0169578 A1* | 9/2004 | Jollenbeck | ........... | H01H 85/046 |
| | | | | 337/231 |
| 2004/0184211 A1 | 9/2004 | Bender et al. | | |
| 2005/0141164 A1 | 6/2005 | Bender et al. | | |
| 2006/0170528 A1* | 8/2006 | Fukushige | ........... | H01H 85/046 |
| | | | | 337/297 |
| 2007/0075822 A1* | 4/2007 | Pachla | ............... | H01H 85/0411 |
| | | | | 337/297 |
| 2008/0191832 A1* | 8/2008 | Tsai | ..................... | H01H 69/022 |
| | | | | 29/623 |
| 2008/0218305 A1 | 9/2008 | Bender et al. | | |
| 2010/0245024 A1 | 9/2010 | Furuuchi et al. | | |
| 2011/0051388 A1* | 3/2011 | Luppold | ................ | H01H 85/10 |
| | | | | 361/834 |
| 2011/0304997 A1 | 12/2011 | Hiramatsu et al. | | |
| 2014/0266564 A1* | 9/2014 | Enriquez | .............. | H01H 85/175 |
| | | | | 337/295 |
| 2020/0161068 A1 | 5/2020 | Enriquez et al. | | |
| 2021/0253777 A1 | 8/2021 | Zhou et al. | | |

FOREIGN PATENT DOCUMENTS

| | | |
|---|---|---|
| JP | 2011258818 A | 12/2011 |
| JP | 5008884 B2 | 8/2012 |
| JP | 2017011191 A | 1/2017 |
| KR | 970039127 A | 7/1997 |
| KR | 20060029444 A | 4/2006 |
| KR | 20090040249 A | 4/2009 |
| KR | 20100027171 A | 3/2010 |
| KR | 101307530 B1 | 9/2013 |
| KR | 20140120422 A | 10/2014 |
| KR | 20150115402 A | 10/2015 |
| KR | 101568339 B1 | 11/2015 |
| KR | 101626726 B1 | 6/2016 |
| KR | 20170050092 A | 5/2017 |
| KR | 20170136889 A | 12/2017 |
| KR | 20200129461 A | 11/2020 |
| KR | 20210036990 A | 4/2021 |
| KR | 20210057638 A | 5/2021 |
| KR | 20210069425 A | 6/2021 |
| KR | 20210081819 A | 7/2021 |
| KR | 20210085173 A | 7/2021 |
| KR | 20210087074 A | 7/2021 |
| WO | 2021040289 A1 | 3/2021 |

OTHER PUBLICATIONS

Extended European Search Report including Written Opinion for Application No. 22887403.8 dated Sep. 3, 2024, pp. 1-10.

\* cited by examiner

【FIG. 1】
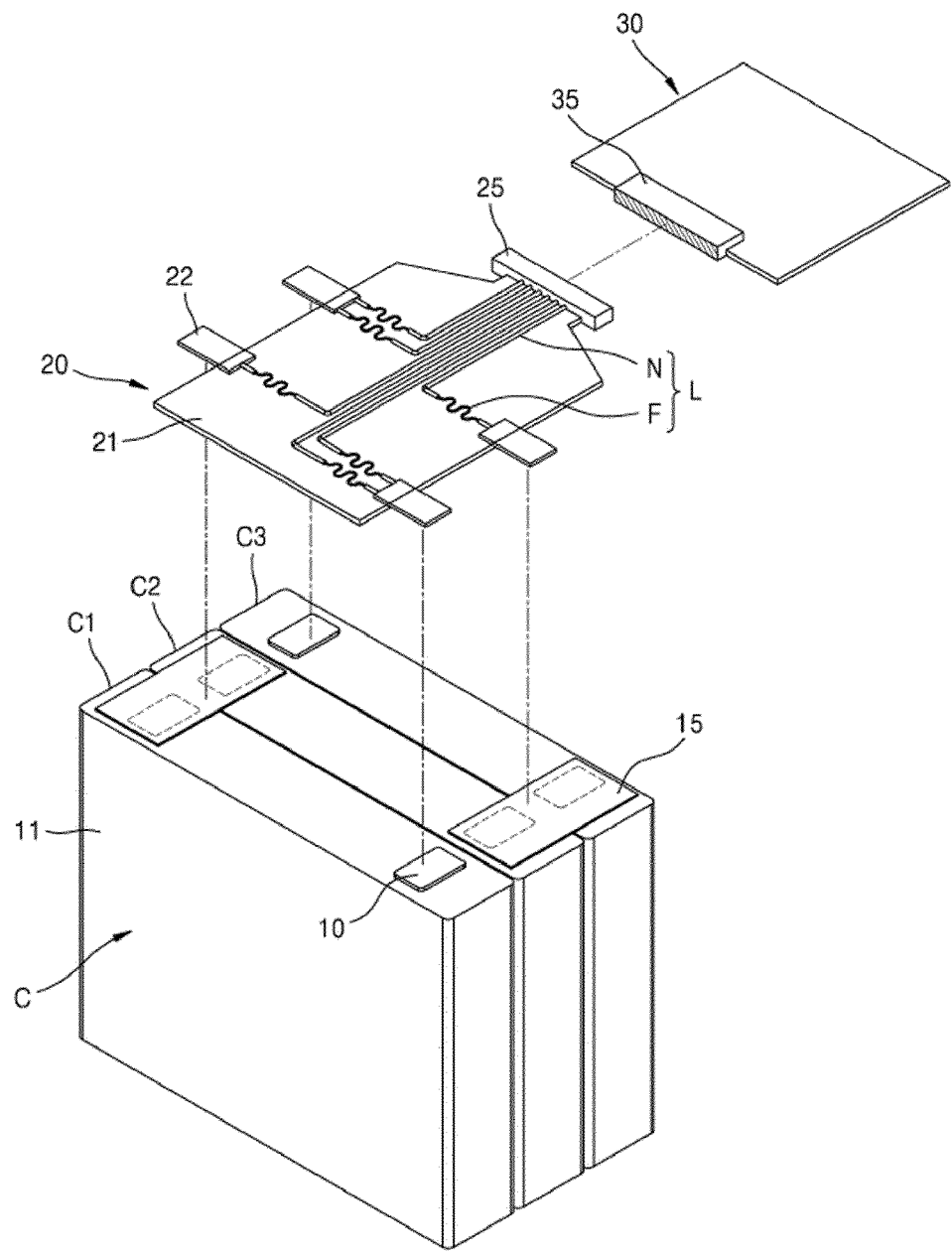
Prior Art

【FIG. 2】
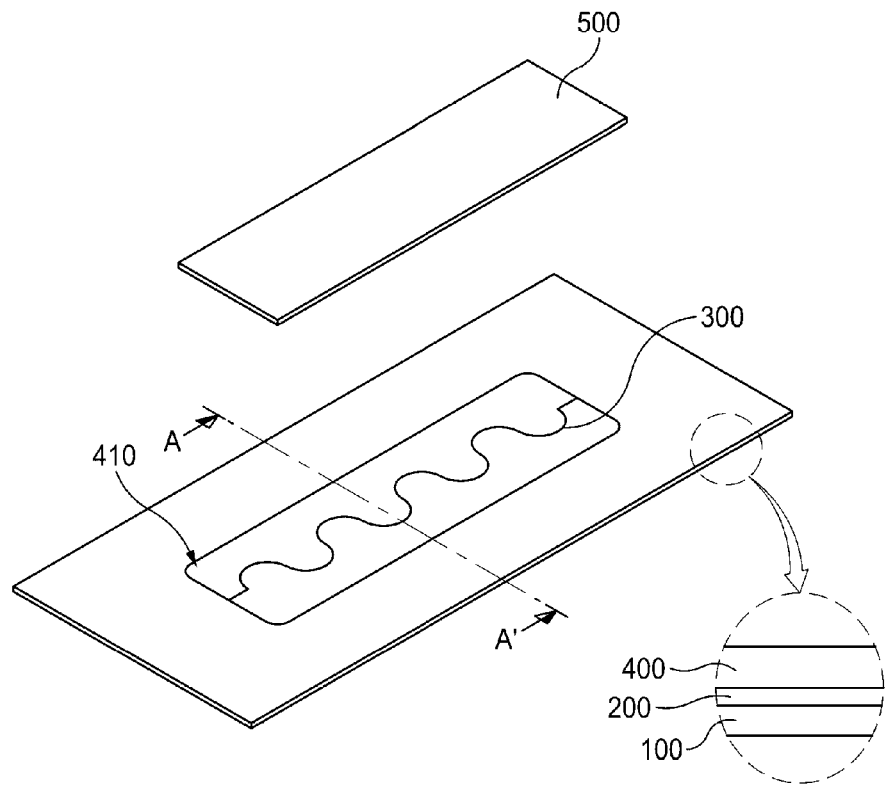
【FIG. 3】
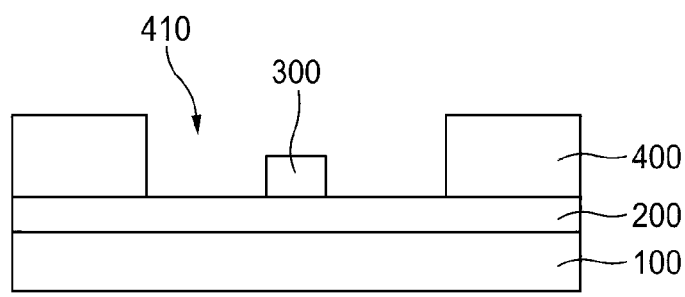
【FIG. 4】
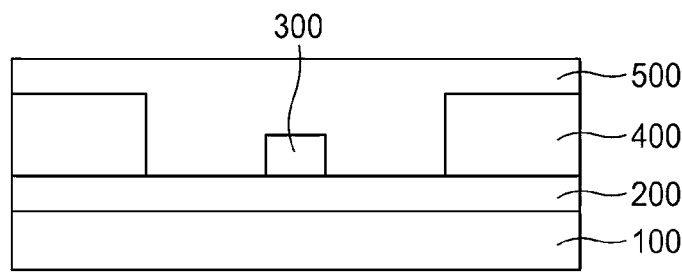

[FIG. 5]
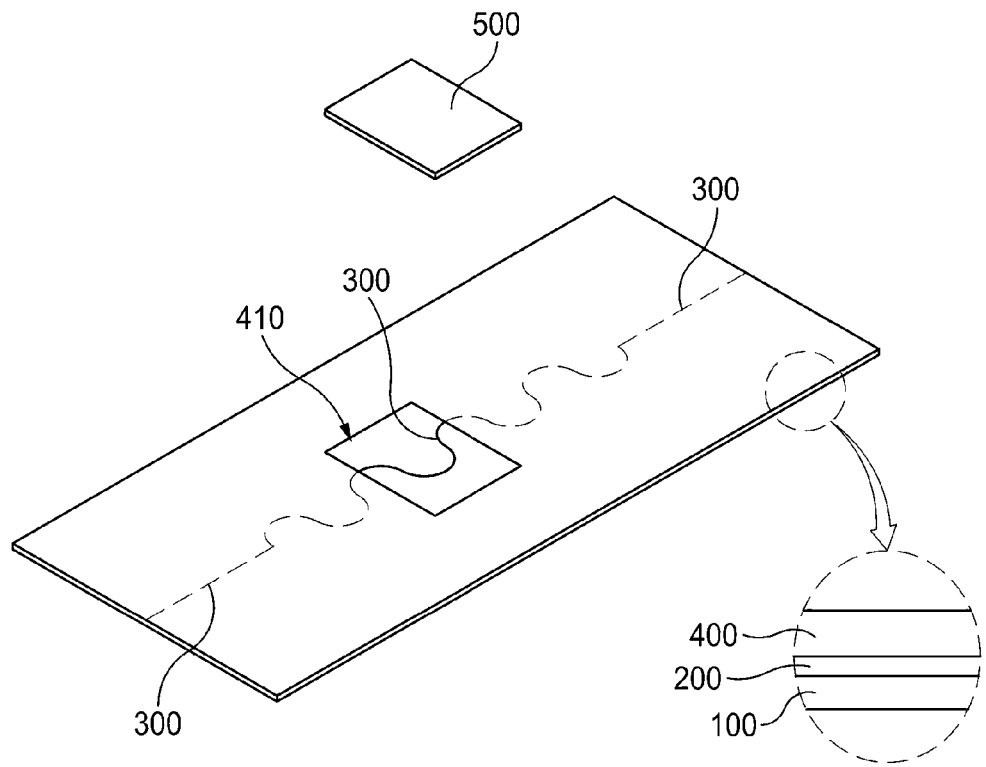
[FIG. 6]
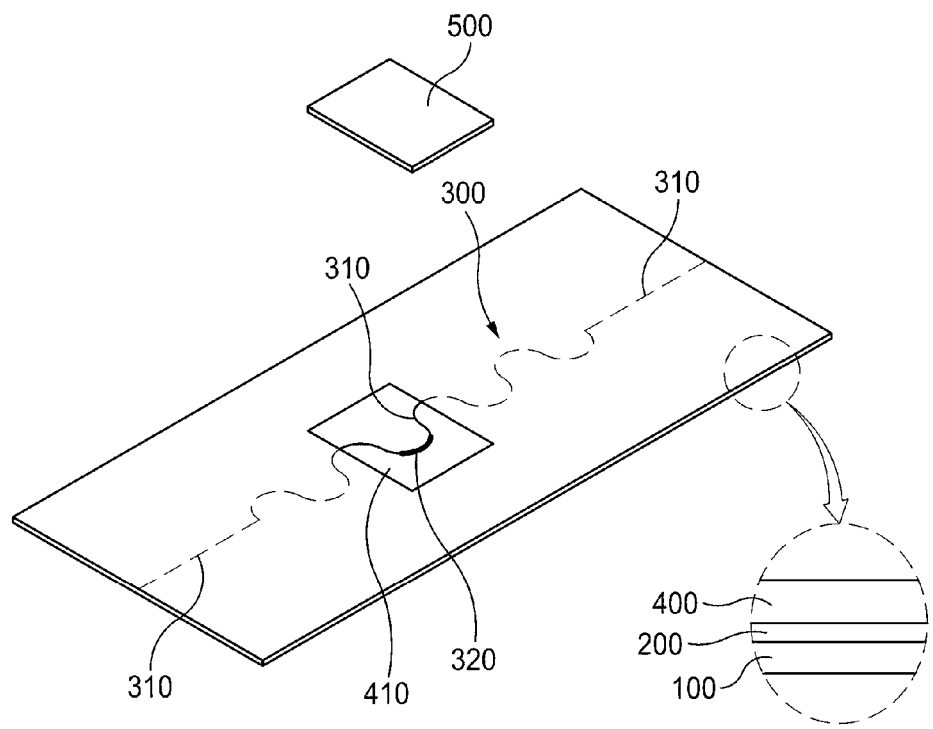

PATTERN FUSE AND METHOD OF MANUFACTURING THE SAME

CROSS-REFERENCE TO RELATED APPLICATIONS

The present application is a continuation of International Application No. PCT/KR2022/015228 filed on Oct. 7, 2022 which claims the benefit of priority to Korean Patent Application No. 2021-0145980 filed on Oct. 28, 2021, Korean Patent Application No. 2021-0149435 filed on Nov. 3, 2021, Korean Patent Application No. 2021-0150061 filed on Nov. 3, 2021, and Korean Patent Application No. 2022-0125697 filed on Sep. 30, 2022, all disclosure of which are incorporated herein by reference.

TECHNICAL FIELD

The present disclosure relates to a pattern fuse and a method of manufacturing the same. More particularly, an aspect of the present invention relates to a pattern fuse capable of preventing ignition due to heat generated during operation of a circuit pattern and inducing cutting of the circuit pattern at a specific position thereof and a method of manufacturing the same.

BACKGROUND ART

With technological development of mobile devices, such as smartphones, laptop computers, and digital cameras, and an increase in demand therefor, research on secondary batteries, which are capable of being charged and discharged, has been actively conducted. In addition, secondary batteries, which are energy sources substituting for fossil fuels causing air pollution, have been applied to an electric vehicle (EV), a hybrid electric vehicle (HEV), a plug-in hybrid electric vehicle (P-HEV), and an energy storage system (ESS).

There are a lithium ion battery, a lithium polymer battery, a nickel cadmium battery, a nickel hydride battery, and a nickel zinc battery as secondary batteries that are widely used at present. A plurality of unit secondary battery cells may be connected to each other in series or in parallel to constitute a battery module depending on required output voltage or charge and discharge capacities. In general, a battery pack is manufactured using at least one battery module by adding an additional component.

Various circuit boards, such as a protection circuit module (PCM) board capable of controlling charge and discharge of the battery cells or protecting the battery cells and a sensing board configured to sense voltage, may be applied to the battery pack, as needed.

In general, such a circuit board is provided with a fuse element configured to prevent fire outbreak or explosion of the battery pack due to overcurrent or short circuit current. A Surface Mounted Device (SMD) fuse or a pattern fuse is used as the fuse element.

FIG. 1 is an exploded perspective view of a battery pack including a circuit board having a conventional fuse pattern formed thereon.

Referring to FIG. 1, which is shown in Korean Patent Application Publication No. 2020-0129461, hereinafter Patent Document 1, a fuse pattern having an overcurrent or short circuit current interruption function is formed on the circuit board instead of a fuse element.

That is, in the battery pack, which includes a plurality of battery cells C1, C2, and C3, a connection circuit board 20 is interposed between a main circuit board 30 and the battery cells C in order to perform connection therebetween, and the connection circuit board 20 is provided with a conductive pattern L including a fuse pattern F and a connection pattern N.

Since the fuse pattern F is located between an electrode tab 22 and the main circuit board 30, there is an advantage in that an operation of mounting a separate fuse element or a space for the fuse element is not necessary. However, the conductive pattern is generally made of a metal, such as copper, and the melting point of the metal is very high (the melting point of copper is about 1085° C.), whereby very high heat and flames may momentarily occur during operation of the fuse pattern.

The pattern fuse of Patent Document 1 is configured such that the conductive pattern is buried in an insulative film, and therefore the insulative film may be ignited at a temperature that is high to such an extent that the pattern fuse is operated.

Meanwhile, a general pattern fuse is manufactured by applying an adhesive to a lower film, stacking a thermally conductive metal layer on the adhesive, and applying a coating agent to an upper film in the state in which the upper film is stacked on the metal layer.

Although the circuit pattern is cut at a temperature that is high to such an extent that the pattern fuse is operated, therefore, it is difficult to predict a region of the circuit pattern that is to be cut, whereby it is difficult to secure reliability in operation.

DISCLOSURE

Technical Problem

The present disclosure has been made in view of the above problems, and it is an aspect of the present invention to provide a pattern fuse capable of preventing ignition due to heat generated during operation of a circuit pattern and a method of manufacturing the same.

It is another aspect of the present invention to provide a pattern fuse capable of inducing cutting of a circuit pattern at a desired position thereof when overcurrent occurs and a method of manufacturing the same.

Technical Solution

A pattern fuse according to an aspect of the present invention to accomplish the above objects includes a lower film layer (100), an adhesive layer (200) stacked on the lower film layer (100), a circuit pattern (300) provided on the adhesive layer (200), the circuit pattern being made of a conductive material, an upper film layer (400) stacked on the adhesive layer (200) and the circuit pattern (300), the upper film layer having an opening (410) formed therein, the opening being configured to allow a part or the entirety of the circuit pattern (300) to be exposed therethrough, and a coating layer (500) configured to cover the opening (410) of the upper film layer (400), wherein the coating layer (500) includes a flame retardant material.

Also, in the pattern fuse according to an aspect of the present invention, the flame retardant material may be a flame retardant material having a flame retardant classification of V-0 based on UL94 standards.

Also, in the pattern fuse according to an aspect of the present invention, the flame retardant material may include an inorganic-based filler.

Also, in the pattern fuse according to an aspect of the present invention, the coating layer (500) may be made of a material that exhibits lower thermal conductivity than the upper film layer (400).

Also, in the pattern fuse according to an aspect of the present invention, the coating layer (500) may be made of a polyurethane-based or urethane-based material.

Also, in the pattern fuse according to an aspect of the present invention, the lower film layer (100) or the upper film layer (400) may include at least one of polyimide (PI), polyethylene naphthalate (PEN), and polyethylene terephthalate (PET).

Also, in the pattern fuse according to an aspect of the present invention, the circuit pattern (300) may include a pair of first metal lines (310), wherein one portion of each of the pair of first metal lines is located under the upper film layer (400), and the remaining portion of each of the pair of first metal lines is located in the opening (410). Wherein a second metal line (320) is configured to electrically connect the pair of first metal lines (310) to each other.

Also, in the pattern fuse according to an aspect of the present invention, each of the pair of first metal lines (310) may be copper, and the second metal line (320) may be a metal having a lower melting point than copper.

Also, in the pattern fuse according to an aspect of the present invention, each of the pair of first metal lines (310) may be copper, and the second metal line (320) may be a metal having higher resistivity than copper.

Also, in the pattern fuse according to an aspect of the present invention, each of the pair of first metal lines (310) may be copper, and the second metal line (320) may be aluminum, tin, or indium.

In addition, an aspect of the present invention provides a circuit board including the pattern fuse.

In addition, an aspect of the present invention provides a battery module including the circuit board.

In addition, an aspect of the present invention provides a battery pack including the battery module.

In addition, a pattern fuse manufacturing method according to an aspect of the present invention provides a first step of preparing a lower film layer (100), second step of forming an adhesive layer (200) on the lower film layer (100), a third step of seating a circuit pattern (300) on the adhesive layer (200), a fourth step of stacking an upper film layer (400) provided with an opening (410), and a fifth step of forming a coating layer (500) so as to cover the opening (410), wherein the coating layer (500) includes a flame retardant material.

Also, in the pattern fuse manufacturing method according to an aspect of the present invention, the coating layer (500) may be made of a material that exhibits lower thermal conductivity than the upper film layer (400).

Also, in the pattern fuse manufacturing method according to an aspect of the present invention, the coating layer (500) may be made of a polyurethane-based or urethane-based material, and the lower film layer (100) or the upper film layer (400) may include at least one of polyimide (PI), polyethylene naphthalate (PEN), and polyethylene terephthalate (PET).

Also, in the pattern fuse manufacturing method according to an aspect of the present invention, the flame retardant material may be a polyurethane-based or urethane-based material.

Advantageous Effects

A pattern fuse according to an aspect of the present invention and a method of manufacturing the same have a merit in that a coating layer including a flame retardant material is provided on a circuit pattern, whereby it is possible to prevent ignition even though the circuit pattern is heated to a high temperature due to operation of the pattern fuse.

In addition, the pattern fuse according to an aspect of the present invention and the method of manufacturing the same have an advantage in that a coating layer including a low endothermic material is provided on a predetermined region of the circuit pattern, whereby it is possible to selectively cut the circuit pattern at the region that abuts the low endothermic coating layer when the pattern fuse is operated, and therefore it is possible to improve reliability in operation.

In addition, the pattern fuse according to an aspect of the present invention and the method of manufacturing the same have a merit in that the circuit pattern is made of different kinds of metal having different melting points or resistivities, whereby it is possible to more accurately control a region to be cut during operation of the pattern fuse.

Furthermore, when the pattern fuse according to an aspect of the present invention is mounted on a circuit board, it is possible to omit a process of mounting a fuse cutting indication means, whereby it is possible to improve efficiency in a process of manufacturing the circuit board.

DESCRIPTION OF DRAWINGS

FIG. 1 is an exploded perspective view of a battery pack including a circuit board having a conventional fuse pattern formed thereon.

FIG. 2 is an exploded perspective view schematically showing a pattern fuse according to a first preferred embodiment of the present invention.

FIG. 3 is a sectional view taken along line A-A' of FIG. 2.

FIG. 4 is a view illustrating the state in which a coating layer is provided in the sectional view of FIG. 3.

FIG. 5 is an exploded perspective view schematically showing a pattern fuse according to a second preferred embodiment of the present invention.

FIG. 6 is an exploded perspective view schematically showing a pattern fuse according to a third preferred embodiment of the present invention.

DETAILED DESCRIPTION

In the present application, it should be understood that the terms "comprises," "has," "includes," etc. specify the presence of stated features, numbers, steps, operations, elements, components, or combinations thereof, but do not preclude the presence or addition of one or more other features, numbers, steps, operations, elements, components, or combinations thereof.

In addition, the same reference numbers will be used throughout the drawings to refer to parts that perform similar functions or operations. In the case in which one part is said to be connected to another part in the specification, not only may the one part be directly connected to the other part, but also, the one part may be indirectly connected to the other part via a further part. In addition, that a certain element is included does not mean that other elements are excluded, but means that such elements may be further included unless mentioned otherwise.

Hereinafter, a pattern fuse according to an embodiment of the present invention will be described with reference to the accompanying drawings.

FIG. 2 is an exploded perspective view schematically showing a pattern fuse according to a first preferred embodiment of the present invention, FIG. 3 is a sectional view taken along line A-A' of FIG. 2, and FIG. 4 is a view illustrating the state in which a coating layer is provided in the sectional view of FIG. 3.

When describing the pattern fuse according to an embodiment of the present invention with reference to FIGS. 2 to 4, the pattern fuse may include a lower film layer 100, an adhesive layer 200, a circuit pattern 300, an upper film layer 400, and a coating layer 500.

First, the lower film layer 100, which is a layer that serves to insulate the conductive circuit pattern 300 from the outside, may be made of any of various known insulative polymer materials.

In particular, polyimide (PI), polyethylene naphthalate (PEN), and polyethylene terephthalate (PET), each of which exhibits excellent thermal characteristics, are preferably used as the material for the lower film layer 100. Thereamong, polyimide (PI) is most preferably used in terms of thermal characteristics.

The adhesive layer 200, which is located on the lower film layer 100, is a layer configured to allow the circuit pattern 300 to be attached to the lower film layer 100 therethrough. The material for the adhesive layer is not particularly restricted as long as the circuit pattern 300 can be adhered thereto.

Here, the circuit pattern 300 is fixed to the top of the lower film layer 100 via the adhesive layer 200; however, a part of the circuit pattern 300 may be slightly depressed in the adhesive layer 200.

The circuit pattern 300 is designed so as to be advantageous in generation of heat using a conductive material, such as copper. The circuit pattern is not limited to a wave form shown in FIG. 2 and may be formed so as to have any of various known shapes.

In addition, the circuit pattern 300 may be made of the same material as a pair of lead wires (not shown) connected to opposite sides of the circuit pattern 300 or may be made of a material that is different in kind from the material for the opposite lead wires and that has a melting point lower than the melting point of the opposite lead wires.

Of course, the thicknesses of the circuit pattern 300 and the opposite lead wires and the length of the circuit pattern 300 may be appropriately designed depending on operating conditions of the pattern fuse.

Next, the upper film layer 400 will be described. The upper film layer 400 performs a function of insulation from the outside, in the same manner as the lower film layer 100 described above. Consequently, the upper film layer may be made of the same material as the lower film layer 100; however, the present invention is not limited thereto, and the upper film layer may be made of any of various insulative polymer materials.

Meanwhile, as shown in FIG. 2, an opening 410 is formed in a central part of the upper film layer 400 such that the entirety of the circuit pattern 300 is exposed. Of course, it is obvious that only a part of the circuit pattern 300 may be exposed.

The opening 410 is covered with the coating layer 500, more specifically a coating layer including a flame retardant material, in order to prevent fire outbreak due to heat or flames generated from the circuit pattern 300.

When the pattern fuse is operated, the temperature of the pattern fuse is increased to such an extent that the material constituting the circuit pattern 300 can be melted, as previously described. In general, the film layer that covers the circuit pattern 300 exhibits low flame retardancy, and therefore fire frequently breaks out.

Of course, it is possible for the film layer that covers the circuit pattern to be made of a material that exhibits high flame retardancy. Since even a part having no circuit pattern must be provided, however, there is a cost increase problem.

Here, it is preferable for a material that is electrically insulative and flame retardant having classification V-0 based on the UL94 V test, which is one of the flame retardancy tests for plastic materials, to be used as the material for the coating layer.

The UL94 V test is a test that evaluates the combustion aspect of a plastic product and the degree of spread of flames to the surroundings of the product when the flames are applied to the product in a vertical direction. Classes V-0, V-1, and V-2 are set based on combustion time. Thereamong, class V-0 is a classification having the highest flame retardancy.

Here, the flame retardant material means a material formed by adding a flame retardant and various additives to a polymer resin composition in order to improve flame retardancy.

There are various known materials, such as polyurethane, urethane, epoxy, and acrylic, as polymer resins that can become a flame retardant material.

Of course, various additives that are generally used, e.g. glass fiber or spherical silica capable of improving flame retardancy alone or an inorganic-based filler mixed therewith, may be further included in the flame retardant material used to form the coating layer.

Meanwhile, if the area of the coating layer 500 is less than the area of the opening 410, it is not possible to completely block the circuit pattern 300 under the coating layer from the outside. Consequently, it is preferable for the area of the coating layer to be equal to the area of the opening 410 so as to cover only the opening 410, and it is more preferable for the area of the coating layer to be slightly greater than the area of the opening 410 so as to partially overlap an edge of the opening 410 including the opening 410.

FIG. 5 is an exploded perspective view schematically showing a pattern fuse according to a second preferred embodiment of the present invention. Since the second embodiment is identical in construction to the first embodiment except for the circuit pattern and the coating layer, only different constructions will be described below.

In the second embodiment of the present invention, a specific part of the circuit pattern 300, i.e. the position at which the circuit pattern is to be cut, may be artificially controlled. That is, as shown in FIG. 5, cutting of the circuit pattern 300 located in a part of the upper film layer 400, more specifically the opening 410 of the upper film layer 400, which is a region that is covered by the coating layer 500, may be induced.

When the pattern fuse is operated, the temperature of the pattern fuse is increased to such an extent that the material constituting the circuit pattern 300 can be melted. At this time, the material for the coating layer 500 may be appropriately adjusted such that the circuit pattern 300 located in the opening 410 can be melted first and cut.

In other words, heat is generated from the circuit pattern 300 during operation thereof. At this time, endothermicity and thermal conductivity of the coating layer 500 that covers the circuit pattern 300 may be reduced such that the circuit pattern 300 can be quickly cut and thus overcurrent can be interrupted in an early stage.

It is preferable for a low endothermic and electrically insulative material that exhibits low thermal conductivity to be used as the material for the coating layer 500 capable of performing the above function.

The low endothermic material means a material that exhibits low endothermicity. Although any of various known low endothermic materials may be used as the low endothermic material, it is preferable for a material that exhibits lower endothermicity and thermal conductivity than polyimide (PI), polyethylene naphthalate (PEN), or polyethylene terephthalate (PET), which is suitable for the material for the lower film layer 100 or the upper film layer 400, to be used as the low endothermic material.

Specifically, polyurethane, urethane, epoxy, and acrylic are used. In particular, a urethane-based material that exhibits low endothermicity and thermal conductivity, a polyurethane-based material that exhibits low endothermicity and thermal conductivity, or a material mainly including a mixture of polyurethane and polyacrylic is preferably used, a material having a thermal conductivity of 0.10 W/mK or less is more preferably used, and a material having a thermal conductivity of 0.05 W/mK or less is most preferably used.

The second embodiment has an advantage in that it is possible to always consistently adjust a region to be cut, whereby reliability in operation as the fuse may be improved. That is, thermal conduction characteristics may vary depending on the position of the pattern fuse, such as the left, middle, or the right of the pattern fuse, and therefore interruption operation time at the time of overcurrent may vary depending on which part of the pattern fuse is cut.

As a result, this means that operation characteristics are inconsistent, and therefore reliability of the fuse is lowered. However, the pattern fuse of an embodiment of the present invention is configured to always be cut at the same position, whereby reliability in operation is improved.

Meanwhile, when the coating layer 500 is manufactured in advance in the form of a film, it is preferable for air to be contained in the film. As an example, air may be formed using a foaming method, such as a molten foam molding method, a cast foam molding method, or a solid foam molding method.

FIG. 6 is an exploded perspective view schematically showing a pattern fuse according to a third preferred embodiment of the present invention. Since the third embodiment is identical in construction to the second embodiment except for the circuit pattern, only different constructions will be described below.

In the third embodiment of the present invention, the circuit pattern 300 may include a first metal line 310 and a second metal line 320. Specifically, a pair of first metal lines 310 is formed so as to face each other, and one portion of each of the first metal lines 310 is located under the upper film layer 400 while the remaining portion of each of the first metal lines 310 is located in the opening 410. The second metal line 320 electrically connects the pair of first metal lines 310 to each other.

Here, the first metal line 310 may be copper, and the second metal line 320 may be a metal having a lower melting point than copper. In addition, the first metal line 310 may be copper, and the second metal line 320 may be a metal having higher resistivity than copper. Furthermore, the first metal line 310 may be copper, and the second metal line 320 may be aluminum, tin, or indium.

When the first metal line 310 and the second metal line 320 correspond to any one of the above combinations, the second metal line 320 is melted first or the connection region between first metal line 310 and the second metal line 320 is cut at the time of operation of the pattern fuse, whereby electrical conduction is interrupted.

Of course, the melting point or the point in time when cutting occurs may be further adjusted by adjusting the length or the thickness of each of the first metal line 310 and the second metal line 320.

Next, a method of manufacturing a pattern fuse according to an embodiment of the present invention will be described.

The method of manufacturing the pattern fuse includes a first step of preparing a lower film layer 100, a second step of forming an adhesive layer 200 on the lower film layer 100, a third step of seating a circuit pattern 300 on the adhesive layer 200, a fourth step of stacking an upper film layer 400 provided with an opening 410, and a fifth step of forming a coating layer 500.

Meanwhile, the circuit pattern 300 may be formed by seating a pattern prepared in advance so as to have a desired shape on the adhesive layer 200 or by directly forming a desired shape on the adhesive layer 200.

Also, in the fourth step of stacking the upper film layer 400, it is more preferable to stack the upper film layer 400 having the opening 410 formed therein in advance although the upper film layer 400 may be stacked on the adhesive layer 200 in the state in which the circuit pattern 300 is seated and then a region corresponding to the opening 410 may be removed such that a part of the circuit pattern 300 is exposed.

Also, in the fifth step of forming the coating layer 500 in the opening 410, a flame retardant material, a low endothermic material, or a low endothermic material that exhibits low thermal conductivity may be applied to the opening 410 and hardened to form the coating layer 500. Of course, a thin film type coating layer 500 containing the above-specified material may be prepared in advance and may then be stacked so as to cover the opening 410.

Here, the material constituting the coating layer 500 may be polyurethane, urethane, epoxy, acrylic, or a mixture of polyurethane and polyacrylic, as previously described. In addition, each of the lower film layer 100 and the upper film layer 400 may be made of polyimide, polyethylene naphthalate, or polyethylene terephthalate.

The pattern fuse may be formed at a predetermined position on a circuit board, such as a printed circuit board (PCB) or a flexible PCB (FPCB), through the above process.

Of course, when the pattern fuse is formed on the circuit board, the circuit pattern 300 may be directly formed on the board without forming a part or the entirety of the lower film layer 100 or the adhesive layer 200 depending on circumstances.

Meanwhile, an embodiment of the present invention may provide a circuit board having the pattern fuse formed thereon and a battery module or a battery pack having the circuit board mounted therein. In addition, the battery module or the battery pack may be used in various kinds of devices.

Although the specific details of the present invention have been described in detail, those skilled in the art will appreciate that the detailed description thereof discloses only preferred embodiments of the present invention and thus does not limit the scope of the present invention. Accordingly, those skilled in the art will appreciate that various changes and modifications are possible, without departing from the category and the technical idea of the present invention, and it will be obvious that such changes and modifications fall within the scope of the appended claims.

DESCRIPTION OF REFERENCE NUMERALS

100: Lower film layer
200: Adhesive layer

300: Circuit pattern
310: First metal line
320: Second metal line
400: Upper film layer
410: Opening
500: Coating layer

The invention claimed is:

1. A pattern fuse comprising:
a lower film layer;
an adhesive layer stacked on the lower film layer;
a circuit pattern provided on the adhesive layer, the circuit pattern being made of a conductive material;
an upper film layer stacked on the adhesive layer and the circuit pattern, the upper film layer having an opening positioned therein, wherein the opening allows a part or an entirety of the circuit pattern to be exposed therethrough; and
a coating layer covering the opening of the upper film layer,
wherein the coating layer includes a low-endothermic material and a protruding portion extending downward into the opening,
wherein the low-endothermic material is configured to increase a temperature of a portion of the pattern fuse such that the portion can be severed.

2. The pattern fuse of claim 1, wherein the coating layer includes a flame-retardant material.

3. The pattern fuse according to claim 2, wherein the flame retardant material has a flame retardant classification of V-0 based on UL94 standards.

4. The pattern fuse according to claim 2, wherein the flame retardant material comprises an inorganic-based filler.

5. The pattern fuse according to claim 1, wherein the coating layer includes a material with lower thermal conductivity than the upper film layer.

6. The pattern fuse according to claim 5, wherein the coating layer is made of a polyurethane-based material or a urethane-based material.

7. The pattern fuse according to claim 6, wherein the lower film layer comprises at least one of polyimide (PI), polyethylene naphthalate (PEN), or polyethylene terephthalate (PET).

8. The pattern fuse according to claim 1, wherein the circuit pattern comprises:
a pair of first metal lines extending into the opening; and
a second metal line configured to electrically connect the pair of first metal lines to each other,
wherein one portion of each of the pair of first metal lines is located under the upper film layer,
wherein a remaining portion of each of the pair of first metal lines is located in the opening.

9. The pattern fuse according to claim 8, wherein
each of the pair of first metal lines is copper, and
the second metal line is a metal having a lower melting point than copper.

10. The pattern fuse according to claim 8, wherein
each of the pair of first metal lines is copper, and
the second metal line is a metal having higher resistivity than copper.

11. The pattern fuse according to claim 8, wherein
each of the pair of first metal lines is copper, and
the second metal line is aluminum, tin, or indium.

12. A circuit board comprising the pattern fuse according to claim 1.

13. A battery module comprising the circuit board according to claim 12.

14. A battery pack comprising the battery module according to claim 13.

15. A pattern fuse manufacturing method of the pattern fuse of claim 1, comprising:
preparing the lower film layer;
forming the adhesive layer on the lower film layer;
seating the circuit pattern on the adhesive layer;
stacking the upper film layer provided with the opening; and
forming the coating layer so as to cover the opening,
wherein the coating layer comprises a flame retardant material.

16. The pattern fuse manufacturing method according to claim 15, wherein the coating layer includes a material with lower thermal conductivity than the upper film layer.

17. The pattern fuse manufacturing method according to claim 15, wherein
the coating layer is made of a polyurethane-based material or a urethane-based material, and
wherein the lower film layer includes at least one of polyimide (PI), polyethylene naphthalate (PEN), or polyethylene terephthalate (PET).

18. The pattern fuse manufacturing method according to claim 15, wherein the flame retardant material is a polyurethane-based material or a urethane-based material.

19. The pattern fuse according to claim 6, wherein the upper film layer comprises at least one of polyimide (PI), polyethylene naphthalate (PEN), or polyethylene terephthalate (PET).

20. The pattern fuse manufacturing method according to claim 15, wherein
the coating layer is made of a polyurethane-based material or a urethane-based material, and
wherein the upper film layer includes at least one of polyimide (PI), polyethylene naphthalate (PEN), or polyethylene terephthalate (PET).

21. The pattern fuse of claim 1, wherein the protruding portion directly contacts the circuit pattern.

22. The pattern fuse of claim 1, wherein a thermal conductivity of the low-endothermic material is 0.10 W/m K or less.

* * * * *